(12) United States Patent
Zhao

(10) Patent No.: US 10,304,915 B2
(45) Date of Patent: May 28, 2019

(54) DISPLAY SUBSTRATE AND METHOD OF FABRICATING DISPLAY SUBSTRATE

(71) Applicant: BOE TECHNOLOGY GROUP CO., LTD., Beijing (CN)

(72) Inventor: Dejiang Zhao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/564,923

(22) PCT Filed: Apr. 17, 2017

(86) PCT No.: PCT/CN2017/080760
§ 371 (c)(1),
(2) Date: Oct. 6, 2017

(87) PCT Pub. No.: WO2017/190585
PCT Pub. Date: Nov. 9, 2017

(65) Prior Publication Data
US 2018/0204891 A1    Jul. 19, 2018

(30) Foreign Application Priority Data

May 3, 2016    (CN) .......................... 2016 1 0286520

(51) Int. Cl.
*H01L 27/32*    (2006.01)
*H01L 51/00*    (2006.01)
(Continued)

(52) U.S. Cl.
CPC ...... *H01L 27/3246* (2013.01); *H01L 51/0005* (2013.01); *H01L 21/84* (2013.01);
(Continued)

(58) Field of Classification Search
None
See application file for complete search history.

(56) References Cited

U.S. PATENT DOCUMENTS

2002/0056842 A1*    5/2002    Yamazaki    ........... H01L 27/3246
257/79
2006/0187399 A1    8/2006    Kim et al.
(Continued)

FOREIGN PATENT DOCUMENTS

CN    101029947 A    9/2007
CN    102428395 A    4/2012
(Continued)

OTHER PUBLICATIONS

International Search Report & Written Opinion dated Jul. 21, 2017, regarding PCT/CN2017/080760.
(Continued)

*Primary Examiner* — Khaja Ahmad
(74) *Attorney, Agent, or Firm* — Intellectual Valley Law, P.C.

(57) ABSTRACT

The present application discloses a method of fabricating a display substrate. The method includes forming a sacrificial layer including a plurality of sacrificial blocks on a base substrate; forming a pixel definition material layer on the base substrate subsequent to forming the sacrificial layer; and removing the sacrificial layer thereby forming a pixel definition layer comprising a plurality of pixel definition blocks. Each of the plurality of sacrificial blocks is formed to have a first side surface distal to the base substrate, a second side surface facing the first side surface and proximal to the base substrate, and a third side surface connecting the first side surface and the second side surface. An average tangential inclination of the third side surface with respect to the second side surface is an acute angle.

20 Claims, 6 Drawing Sheets

(51) Int. Cl.
    *H01L 21/84* (2006.01)
    *H01L 51/56* (2006.01)
    *H01L 51/50* (2006.01)
    *H01L 51/52* (2006.01)
(52) U.S. Cl.
    CPC ...... *H01L 51/5056* (2013.01); *H01L 51/5206* (2013.01); *H01L 51/5221* (2013.01); *H01L 51/56* (2013.01)

(56) References Cited

U.S. PATENT DOCUMENTS

| | | | |
|---|---|---|---|
| 2010/0029028 A1* | 2/2010 | Song | H01L 27/3246 438/29 |
| 2010/0051912 A1* | 3/2010 | Gregory | H01L 27/3246 257/40 |
| 2010/0193791 A1* | 8/2010 | Chun | H01L 27/3246 257/59 |
| 2014/0197396 A1* | 7/2014 | Madigan | H01L 51/0005 257/40 |
| 2014/0300853 A1* | 10/2014 | Kim | G02F 1/134336 349/144 |
| 2015/0194629 A1 | 7/2015 | Liu et al. | |
| 2015/0226998 A1* | 8/2015 | Bang | G02F 1/133377 349/43 |
| 2015/0333110 A1* | 11/2015 | Park | H01L 21/308 257/40 |
| 2016/0204305 A1* | 7/2016 | Chiu | H01L 25/0753 257/94 |
| 2016/0247862 A1 | 8/2016 | Song et al. | |
| 2016/0351635 A1 | 12/2016 | Li | |

FOREIGN PATENT DOCUMENTS

| | | |
|---|---|---|
| CN | 103413819 A | 11/2013 |
| CN | 104167430 A | 11/2014 |
| CN | 104393192 A | 3/2015 |
| CN | 105826355 A | 8/2016 |

OTHER PUBLICATIONS

First Office Action in the Chinese Patent Application No. 201610286520.2, dated Dec. 2, 2016; English translation attached.
Notification to Grant Patent Right for Invention in the Chinese Patent Application No. 201610286520.2, dated Feb. 6, 2017; English translation attached.

\* cited by examiner

DISPLAY SUBSTRATE AND METHOD OF FABRICATING DISPLAY SUBSTRATE

CROSS-REFERENCE TO RELATED APPLICATION

This application is a national stage application under 35 U.S.C. § 371 of International Application No. PCT/CN2017/080760, filed Apr. 17, 2017, which claims priority to Chinese Patent Application No. 201610286520.2, filed May 3, 2016, the contents of which are incorporated by reference in the entirety.

TECHNICAL FIELD

The present invention relates to display technology, more particularly, to a display substrate and a method, of fabricating a display substrate.

BACKGROUND

As compared to other display devices such as liquid crystal display (LCD) devices, the organic light emitting diode (OLED) display apparatuses are self-emitting apparatuses that do not require a backlight. Having the advantages of fast response, a wider viewing angle, high brightness, more vivid color rendering, thinner and lighter, they have found a wide range of applications in display field.

Typically, an OLED display apparatus includes an anode, one or more organic functional layers and a cathode. The one or more organic functional layers typically includes a light emitting layer (EML), and optionally one or more of a hole injection layer (HIL), a hole transport layer (HTL), an electron transport layer (ETL), and an electrode injection layer (EIL). When a voltage is applied between the cathode and the anode, charge carriers (electrons and holes) are injected from the cathode and the anode into the light emitting layer. The electrons and holes are recombined in the light emitting layer, which emits light.

SUMMARY

In one aspect, the present invention provides a method of fabricating a display substrate, comprising forming a sacrificial layer comprising a plurality of sacrificial blocks on a base substrate; forming a pixel definition material layer on the base substrate subsequent to forming the sacrificial layer; and removing the sacrificial layer thereby forming a pixel definition layer comprising a plurality of pixel definition blocks; wherein each of the plurality of sacrificial blocks is formed to have a first side surface distal to the base substrate, a second side surface facing the first side surface and proximal to the base substrate, and a third side surface connecting the first side surface and the second side surface; and an average tangential inclination of the third side surface with respect to the second side surface is an acute angle.

Optionally, an included angle between the third side surface and the second side surface is an acute angle.

Optionally, the acute angle is in a range of approximately 30 degrees and approximately 75 degrees.

Optionally, a cross-section of each of the plurality of sacrificial blocks along a plane normal to the base substrate has a substantially trapezoidal shape; and a short base of the trapezoidal shape is on the first side surface and a long base of the trapezoidal shape is on the second side surface.

Optionally, each of the plurality of pixel definition blocks is formed to have a first side surface distal to the base substrate, a second side surface facing the first side surface and proximal to the base substrate, and a third side surface connecting the first side surface and the second side surface; and an average tangential inclination of the third side surface with respect to the second side surface is an obtuse angle.

Optionally, the obtuse angle is in a range of approximately 105 degrees to approximately 150 degrees.

Optionally, a cross-section of each of the plurality of pixel definition blocks along a plane normal to the base substrate has a substantially inverted trapezoidal shape; and a short base of the inverted trapezoidal shape is on the second side surface and a long base of the inverted trapezoidal shape is on the first side surface.

Optionally, a cross-section of each of the plurality of pixel definition blocks along a plane normal to the base substrate comprises a first section proximal to the base substrate and a second section distal to the base substrate; the first section has a substantially inverted trapezoidal shape and a short base of the inverted trapezoidal shape is on the second side surface; and the second section has a substantially rectangular shape.

Optionally, subsequent to removing the sacrificial layer, further comprising forming an ink-jet printed layer comprising a plurality of ink-jet printed blocks by ink-jet printing; wherein each of the plurality of ink-jet printed blocks is formed to have a first side surface distal to the base substrate, a second side surface facing the first side surface and proximal to the base substrate, and a third side surface connecting the first side surface and the second side surface; and an average tangential inclination of the third side surface with respect to the second side surface is an acute angle.

Optionally, the acute angle is in a range of approximately 30 degrees and approximately 75 degrees.

Optionally, the pixel definition material layer is formed to have a maximum thickness along a direction normal to the base substrate smaller than or equal to that of the sacrificial layer; and the method further comprises curing the pixel definition material layer prior to removing the sacrificial layer.

Optionally, the pixel definition material layer is formed to have a maximum thickness along a direction normal to the base substrate greater than that of the sacrificial layer; each of the plurality of sacrificial blocks has a first side surface distal to the base substrate and a second side surface facing the first side surface and proximal to the base substrate; the pixel definition material layer is formed to have a first section covering the first side surface of each of the plurality of sacrificial blocks and a second section outside the first section; and the method further comprising, prior to removing the sacrificial layer, removing at least a portion of the first section thereby exposing the sacrificial layer; and curing the pixel definition material layer subsequent to removing at least a portion of the first section and prior to removing the sacrificial layer.

Optionally, the sacrificial layer is made of a metal material; forming the sacrificial layer comprises forming a metal material layer on the base substrate and patterning the metal material layer to form the plurality of sacrificial blocks; and removing the sacrificial layer comprises etching the plurality of sacrificial blocks using a wet etchant.

Optionally, the wet etchant comprises one or a combination of etchants selected from the group consisting of hydrochloric acid, nitric acid, and phosphoric acid.

Optionally, the metal material layer is made of one or a combination of metals selected from the group consisting of molybdenum, aluminum, and silver.

Optionally, each of the plurality of sacrificial blocks is formed to have a shape selected form the group consisting of a truncated rectangular pyramid shape, a truncated square pyramid shape, and a truncated cone shape.

In another aspect, the present invention provides a display substrate comprising a base substrate; and a pixel definition layer comprising a plurality of pixel definition blocks on the base substrate; wherein each of the plurality of pixel definition blocks has a first side surface distal to the base substrate, a second side surface facing the first side surface and proximal to the base substrate, and a third side surface connecting the first side surface and the second side surface; and an average tangential inclination of the third side surface with respect to the second side surface is an obtuse angle.

Optionally, the obtuse angle is in a range of approximately 105 degrees to approximately 150 degrees.

Optionally, a cross-section of each of the plurality of pixel definition blocks along a plane normal to the base substrate has a substantially inverted trapezoidal shape; and a short base of the inverted trapezoidal shape is on the second side surface and a long base of the inverted trapezoidal shape is on the first side surface.

Optionally, a cross-section of each of the plurality of pixel definition blocks along a plane normal to the base substrate comprises a first section proximal to the base substrate and a second section distal to the base substrate; the first section has a substantially inverted trapezoidal shape and a short base of the inverted trapezoidal shape is on the second side surface; and the second section has a substantially rectangular shape.

Optionally, the display substrate further comprises an ink-jet printed layer comprising a plurality of ink-jet printed blocks in a subpixel region of the display substrate; wherein each of the plurality of ink-jet printed blocks has a first side surface distal to the base substrate, a second side surface facing the first side surface and proximal to the base substrate, and a third side surface connecting the first side surface and the second side surface; an average tangential inclination of the third side surface with respect to the second side surface is an acute angle.

Optionally, the acute angle is in a range of approximately 30 degrees and approximately 75 degrees.

Optionally, a cross-section of each of the plurality of ink-jet printed blocks along a plane normal to the base substrate has a substantially trapezoidal shape; and a short base of the trapezoidal shape is on the first side surface and a long base of the trapezoidal shape is on the second side surface.

Optionally, the ink-jet printed layer comprises an organic light emitting material; and the display substrate is an array substrate.

Optionally, the ink-jet printed layer is a color filter layer; and the display substrate is a color filter substrate.

Optionally, the pixel definition layer comprises a resin material; and the display substrate is an array substrate.

Optionally, the pixel definition layer comprises a resin material and a black pigment; and the display substrate is a color filter substrate.

In another aspect, the present invention provides a display apparatus comprising a display substrate described herein.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

Figure 1:
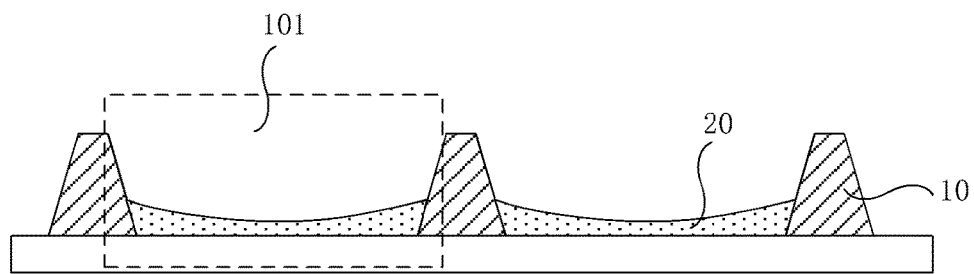
FIG. 1 is a schematic diagram illustrating the structure of a conventional display substrate having a pixel definition layer.

FIG. 1 is a schematic diagram illustrating the structure of a conventional display substrate having a pixel definition layer. Referring to FIG. 1, the display substrate includes an organic light emitting layer 20 in the subpixel region 101. The organic light emitting layer 20 may be formed by an ink jet printing method. Specifically, a pixel definition layer 10 is formed on a base substrate thereby defining the subpixel region 101, and subsequently an ink material is dispensed into the subpixel region 101 thereby forming the organic light emitting layer 20. It was discovered in the present disclosure that the ink solution dispensed into the subpixel region 10 often climbs up along the side walls of the pixel definition layer. When the ink material is dried, the organic light emitting layer 20 formed by this method has an uneven thickness distribution. For example, the peripheral portion of the organic light emitting layer 20 may have a greater thickness than the central portion of the organic light emitting layer 20. This results in uneven brightness distribution of light emission in the display panel having the conventional display substrate, adversely affecting display quality.

Accordingly, the present invention provides, inter alia, a display substrate and a method of fabricating a display substrate that substantially obviate one or more of the problems due to limitations and disadvantages of the related art. In one aspect, the present disclosure provides a method of fabricating a display substrate. In some embodiments, the method includes forming a sacrificial layer comprising a plurality of sacrificial blocks on a base substrate; forming a pixel definition material layer on the base substrate subsequent to forming the sacrificial layer; and removing the sacrificial layer thereby forming a pixel definition layer comprising a plurality of pixel definition blocks. Optionally, each of the plurality of sacrificial blocks is formed to have a first side surface distal to the base substrate, a second side surface facing the first side surface and proximal to the base substrate, and a third side surface connecting the first side surface and the second side surface. Optionally, an average tangential inclination of the third side surface with respect to the second side surface is an acute angle.

Figure 2:
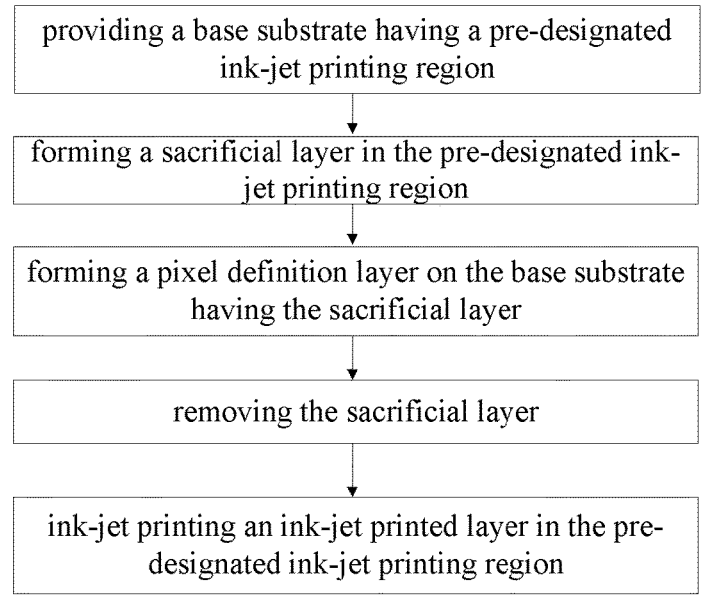
FIG. 2 is a flow chart illustrating a method of fabricating a display substrate in some embodiments according to the present disclosure.

FIG. 2 is a flow chart illustrating a method of fabricating a display substrate in some embodiments according to the present disclosure. Referring to FIG. 2, the method in some embodiments includes providing a base substrate having a pre-designated ink-jet printing region; forming a sacrificial layer in the pre-designated ink-jet printing region; forming a pixel definition layer on the base substrate having the sacrificial layer; removing the sacrificial layer; and ink-jet printing an ink-jet printed layer in the pre-designated ink-jet printing region.

In some embodiments, the pre-designated ink-jet printing region corresponds to the subpixel region of a display substrate, and the pixel definition layer is in a region corresponding to the inter-subpixel region of a display substrate.

As used herein, a subpixel region refers to a light emission region of a subpixel, such as a region corresponding to a pixel electrode in a liquid crystal display, or a region corresponding to a light emissive layer in an organic light emitting diode display panel, or a region corresponding to the ink-jet printed layer according to the present disclosure. Optionally, a pixel may include a number of separate light emission regions corresponding to a number of subpixels in the pixel. Optionally, the subpixel region is a light emission region of a red color subpixel. Optionally, the subpixel region is a light emission region of a green color subpixel. Optionally, the subpixel region is a light emission region of a blue color subpixel. Optionally, the subpixel region is a light emission region of a white color subpixel.

As used herein, an inter-subpixel region refers to a region between adjacent subpixel regions, such as a region corresponding to a black matrix in a liquid crystal display, a region corresponding a pixel definition layer in an organic light emitting diode display panel, or the pixel definition layer according to the present disclosure. Optionally, the inter-subpixel region is a region between adjacent subpixel regions in a same pixel. Optionally, the inter-subpixel region is a region between two adjacent subpixel regions from two adjacent pixels. Optionally, the inter-subpixel region is a region between a subpixel region of a red color subpixel and a subpixel region of an adjacent green color subpixel. Optionally, the inter-subpixel region is a region between a subpixel region of a red color subpixel and a subpixel region of an adjacent blue color subpixel. Optionally, the inter-subpixel region is a region between a subpixel region of a green color subpixel and a subpixel region of an adjacent blue color subpixel.

Figure 3A:
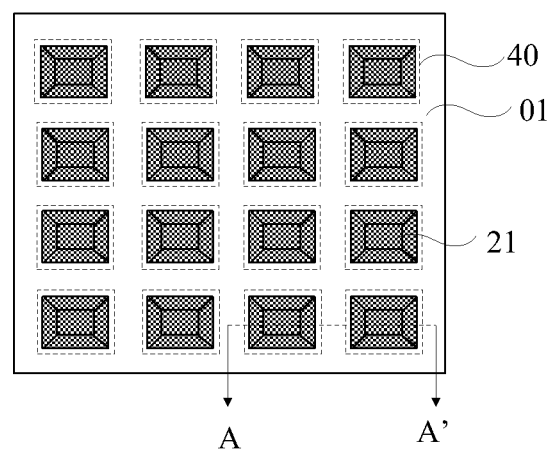
FIG. 3A is a schematic diagram illustrating the structure of a sacrificial layer formed on a display substrate in some embodiments according to the present disclosure.

FIG. 3A is a schematic diagram illustrating the structure of a sacrificial layer formed on a display substrate in some embodiments according to the present disclosure. Referring to FIG. 3A, the base substrate 01 includes a plurality of pre-designated ink-jet printing region 40 in a matrix form. Optionally, each pre-designated ink-jet printing region 40 corresponds to a subpixel region. A sacrificial layer having a plurality of sacrificial blocks 21 is formed on the base substrate 01, each sacrificial block 21 being formed in a pre-designated ink-jet printing region 40.

Figure 3B:
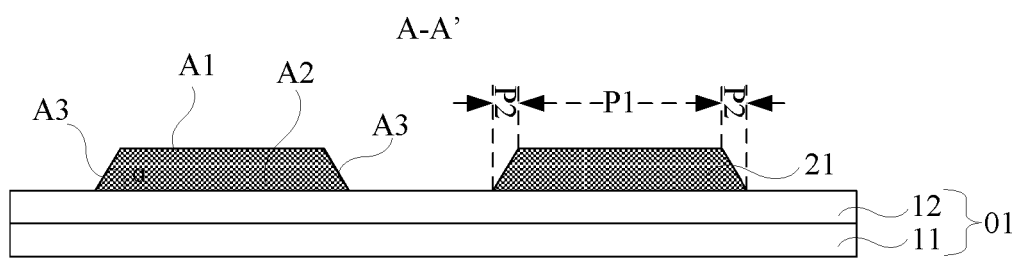
FIG. 3B is a cross-sectional view along the A-A' line in FIG. 3A.

FIG. 3B is a cross-sectional view along the A-A' line in FIG. 3A. Referring to FIG. 3B, each of the plurality of sacrificial blocks 21 includes a central portion P1 and a peripheral portion P2 surrounding the central portion P1, a thickness of the peripheral portion P2 along a direction normal to the base substrate 01 decreases along a direction from the central portion P1 toward the peripheral portion P2.

Optionally, each sacrificial block 21 has a first side surface A1 distal to the base substrate 01 and a second side surface A2 facing the first side surface A2 and proximal to the base substrate 01. Optionally, the first side surface A1 and the second side surface A2 are substantially parallel to each other. An area of the first side surface A1 is less than an area of the second side surface A2. Optionally, each of the plurality of sacrificial blocks 21 has a third side surface A3 connecting the first side surface A1 and the second side surface A2, an average tangential inclination of the third side surface A3 with respect to the second side surface A2 is an acute angle $\alpha$. Optionally, an included angle between the third side surface A3 and the second side surface A2 is an acute angle $\alpha$. Optionally, the acute angle $\alpha$ is in a range of approximately 30 degrees and approximately 75 degrees. Optionally, an average tangential inclination of the third side surface A3 with respect to the first side surface A1 is an obtuse angle. Optionally, an included angle between the third side surface A3 and the first side surface A1 is an obtuse angle. Optionally, the obtuse angle is in a range of approximately 105 degrees to approximately 150 degrees. Optionally, each of the plurality of sacrificial blocks 21 has a shape selected form the group consisting of a truncated rectangular pyramid shape, a truncated square pyramid shape, and a truncated cone shape.

Referring to FIG. 3B, in some embodiments, a cross-section of each of the plurality of sacrificial blocks 21 along a plane normal to the base substrate 01 has a substantially trapezoidal shape. A short base of the trapezoidal shape is on the first side surface A1 and a long base of the trapezoidal shape is on the second side surface A2.

In some embodiments, the base substrate 01 includes a transparent substrate 11 and optionally a thin film 12 on the transparent substrate 11. Optionally, the base substrate 01 is a base substrate in an organic light emitting display panel, and the thin film 12 is made of a transparent conductive material such as indium tin oxide. Optionally, the thin film 12 is an anode of the organic light emitting display panel.

Figure 4A:
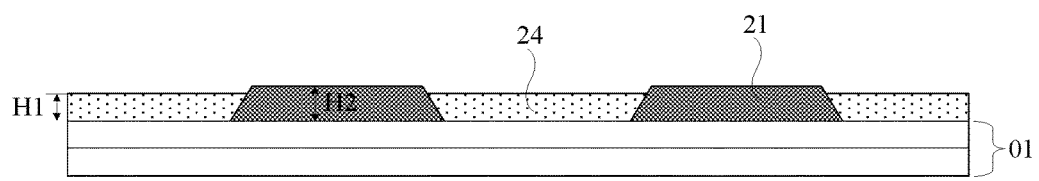
FIGS. 4A-4C illustrate a process of fabricating a display substrate in some embodiments according to the present disclosure.
Figure 4B:
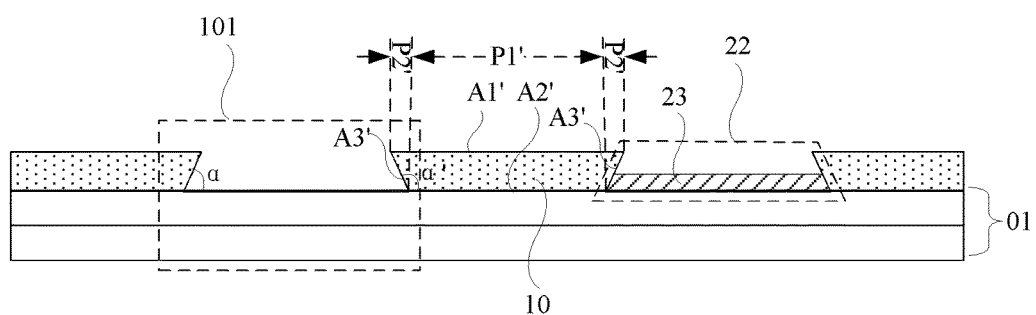

Subsequent to forming the sacrificial layer, the method in some embodiments further includes forming a pixel definition layer. FIGS. 4A-4B illustrate a process of fabricating a display substrate in some embodiments according to the present disclosure. Referring to FIG. 4A, the step of forming the pixel definition layer includes forming a pixel definition material layer 24 on the base substrate 01.

In some embodiments, the display substrate is an array substrate, and the pixel definition layer functions to separate adjacent subpixels in the array substrate. Optionally, the pixel definition material layer 24 is made of a resin material. In some embodiments, the display substrate is a color filter substrate. Optionally, the pixel definition material layer 24 is made of a resin material and further includes a black pigment. Optionally, the pixel definition layer in the color filter substrate functions as a black matrix. Examples of appropriate resin materials include, but are not limited to, an epoxy resin.

In some embodiments, the step of forming the pixel definition layer further includes removing the sacrificial layer thereby forming a pixel definition layer including a plurality of pixel definition blocks. Referring to FIG. 4B, subsequent to removing the sacrificial layer, a pixel definition layer including a plurality of pixel definition blocks 10 is formed on the base substrate 01. Each of the plurality of pixel definition blocks 10 includes a central portion P1' and a peripheral portion P2' surrounding the central portion P1'. A thickness of the peripheral portion P1' along a direction normal to the base substrate 01 decreases along a direction from the central portion P1' toward the peripheral portion P2'. Optionally, each of the plurality of pixel definition blocks 10 has a first side surface A1' distal to the base substrate 01 and a second side surface A2' facing the first side surface A1' and proximal to the base substrate 01, an area of the second side surface A2' being less than an area of the first side surface A1'. Optionally, the first side surface A1' and the second side surface A2' are substantially parallel to each other. Optionally, each of the plurality of pixel definition blocks 10 has a third side surface A3' connecting the first side surface A1' and the second side surface A2', and an average tangential inclination of the third side surface A3' with respect to the second side surface A2' is an obtuse angle α'. Optionally, an included angle between the third side surface A3' and the second side surface A2' is an obtuse angle α'. Optionally, the obtuse angle α' is in a range of approximately 105 degrees to approximately 150 degrees. Optionally, an average tangential inclination of the third side surface A3' with respect to the first side surface A1' is an acute angle. Optionally, an included angle between the third side surface A3' and the first side surface A1' is an acute angle. Optionally, the acute angle is in a range of approximately 30 degrees and approximately 75 degrees.

Referring to FIG. 4B, in some embodiments, a cross-section of each of the plurality of pixel definition blocks 10 along a plane normal to the base substrate f has a substantially inverted trapezoidal shape. A short base of the inverted trapezoidal shape is on the second side surface A2' and a long base of the inverted trapezoidal shape is on the first side surface A1'.

Figure 4C:
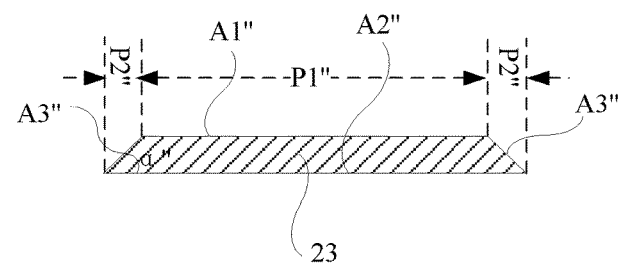

Subsequent to removing the sacrificial layer, the method in some embodiments further includes forming an ink-jet printed layer by ink-jet printing. Referring to FIG. 4B, the ink-jet printed layer includes a plurality of ink-jet printed blocks 23. FIG. 4C is a zoom-in view of an ink-jet printed block 23. Referring to FIG. 4C, each of the plurality of ink-jet printed blocks 23 includes a central portion P1" and a peripheral portion P2" surrounding the central portion P1". A thickness of the peripheral portion P2" along a direction normal to the base substrate decreases along a direction from the central portion P1" toward the peripheral portion P2". Moreover, each of the plurality of ink-jet printed blocks 23 has a first side surface A1" distal to the base substrate and a second side surface A2" facing the first side surface A1" and proximal to the base substrate. An area of the first side surface A1" is less than an area of the second side surface A2". Optionally, the first side surface A1" and the second side surface A2" are substantially parallel to each other. Optionally, each of the plurality of ink-jet printed blocks 23 has a third side surface A3" connecting the first side surface A1" and the second side surface A2". An average tangential inclination of the third side surface A3" with respect to the second side surface A2" is an acute angle α". An included angle between the third side surface A3" and the second side surface A2" is an acute angle α". Optionally, the acute angle α" is in a range of approximately 30 degrees and approximately 75 degrees. Optionally, an average tangential inclination of the third side surface A3" with respect to the first side surface A1" is an obtuse angle. Optionally, an included angle between the third side surface A3" and the first side surface A1" is an obtuse angle. Optionally, the obtuse angle is in a range of approximately 105 degrees to approximately 150 degrees.

Optionally, α, α', and α" are substantially the same.

Optionally, the sacrificial layer and the ink-jet printed layer are formed in a subpixel region of the display substrate.

In some embodiments, the display substrate is an array substrate, and the pixel definition layer functions to separate adjacent subpixels in the array substrate. Optionally, the ink-jet printed layer includes an organic light emitting material for forming an organic light emitting layer. In some embodiments, the display substrate is a color filter substrate. Optionally, the pixel definition layer in the color filter substrate functions as a black matrix. Optionally, the ink-jet printed layer is a color filter layer, e.g., a red color filter layer, a green color filter layer, a blue color filter layer.

In some embodiments, the average tangential inclination of the third side surface A3 with respect to the second side surface A2 is an acute angle α. Optionally, the included angle between the third side surface A3 and the second side surface A2 of the sacrificial layer is an acute angle α. Referring to FIG. 4B and FIG. 4C, when the sacrificial layer is removed and the ink-jet printed layer is formed, the third side surface A3' of the pixel definition block 10 is in contact with the third side surface A3" of the ink-jet printed block 23. An average tangential inclination of the third side surface A3" of ink-jet printed block with respect to the base substrate 01 is substantially the same as the included angle α. An included angle between the third side surface A3" of ink-jet printed block and the base substrate 01 is substantially the same as the included angle α. By having this design, when the sacrificial layer is removed and the ink-jet printed layer is formed, the third side surface A3' of the pixel definition block 10 prevents the ink in the ink-jet printed block 23 to climb up the side wall on the third side surface A3' of the pixel definition block 10 during the ink drying process, thereby reducing the likelihood of forming an ink-jet printed block 23 having the central portion thinner than the peripheral portion. An ink-jet printed block 23 having a substantially uniform thickness may be achieved by the present method, resulting in an even brightness distribution of light emission in the display panel having a display substrate fabricated by the present method.

Referring to FIG. 4A, the pixel definition material layer 24 in some embodiments is formed to have a maximum thickness H1 along a direction normal to the base substrate 01 smaller than or equal to a maximum thickness H2 along a direction normal to the base substrate 01 of the sacrificial block 21. Optionally, the method further includes curing the pixel definition material layer 24 prior to removing the sacrificial layer. Optionally, the pixel definition material layer 24 is made of a positive photoresist material, and the step of curing the pixel definition material layer 24 includes heating the pixel definition material layer 24. Optionally, the pixel definition material layer 24 is made of a negative photoresist material, and the step of curing the pixel definition material layer 24 includes exposing the pixel definition material layer 24. Optionally, the step of exposing the pixel definition material layer 24 is performed using a mask plate, a light transmissive portion of the mask plate corresponding to the pixel definition material layer 24 and a light blocking portion of the mask plate corresponding to the sacrificial layer, thereby curing the pixel definition material layer 24.

Subsequent to curing the pixel definition material layer 24, the sacrificial layer is removed thereby forming the pixel definition layer. Referring to FIG. 4B, the method further includes forming an ink-jet printed layer by ink-jet printing.

Referring to FIG. 4B and FIG. 4C, when the sacrificial layer is removed and the ink-jet printed layer is formed, the third side surface A3' of the pixel definition block 10 prevents the ink in the ink in the ink-jet printed block 23 to climb up the side wall on the third side surface A3' of the pixel definition block 10 during the ink drying process, thereby reducing the likelihood of forming an ink-jet printed block 23 having the central portion thinner than the peripheral portion. An ink-jet printed block 23 having a substantially uniform thickness may be achieved by the present method, resulting in an even brightness distribution of light emission in the display panel having a display substrate fabricated by the present method.

Figure 5A:
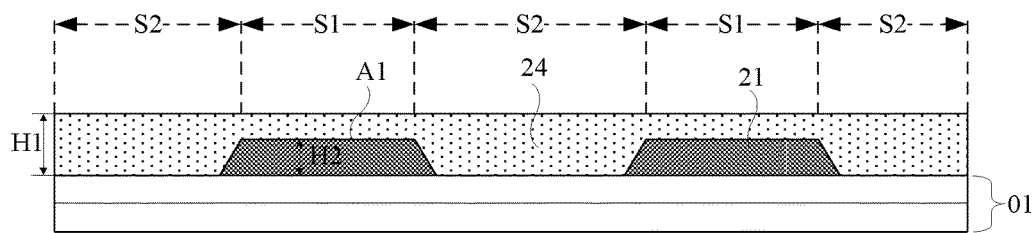
FIGS. 5A-5C illustrate a process of fabricating a display substrate in some embodiments according to the present disclosure.
Figure 5B:
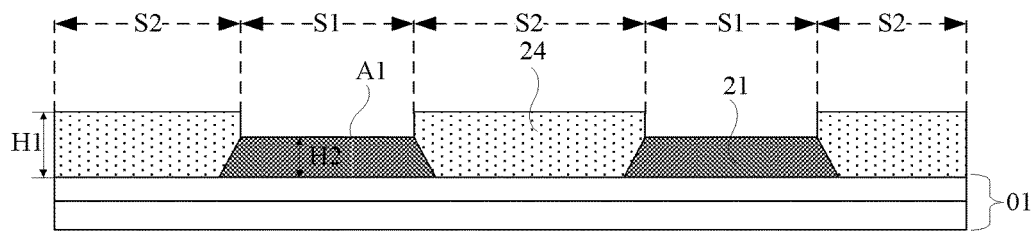
Figure 5C:
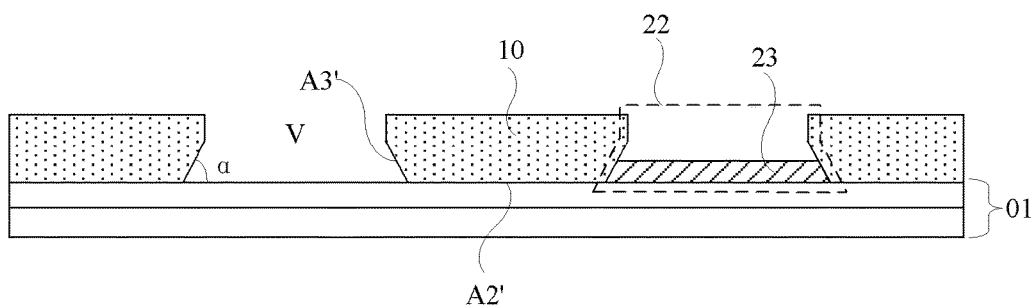

FIGS. 5A-5C illustrate a process of fabricating a display substrate in some embodiments according to the present disclosure. Referring to FIG. 5A, the pixel definition material layer 24 is formed to have a maximum thickness H1 along a direction normal to the base substrate 01 greater than a maximum thickness H2 along a direction normal to the base substrate 01 of the sacrificial layer. As shown in FIG. 5A the pixel definition material layer 24 is formed to have a first section S1 covering the first side surface A1 of each of the plurality of sacrificial blocks 21 and a second section 82 outside the first section S1. Optionally, the first section S1 is in a subpixel region of the display substrate. Optionally, the second section S2 is in an inter-subpixel region of the display substrate. The pixel definition material layer 24 is formed to cover the sacrificial layer.

In some embodiments, prior to removing the sacrificial layer, the method further includes removing at least a portion of the first section S thereby exposing the sacrificial layer, and curing the pixel definition material layer 24 subsequent to removing at least a portion of the first section S1 and prior to removing the sacrificial layer. Referring to FIG. 5B, the entire first section S1 is removed thereby exposing the entire first side surface A1 of the sacrificial block 21.

In some embodiments, the pixel definition material layer 24 is made of a positive photoresist material. Optionally, the method includes exposing at least a portion of the first section S1 of the pixel definition material layer 24. Optionally, the step of exposing is performed using a mask plate. Optionally, the method includes exposing the pixel definition material layer 24 using a mask plate, a light transmissive portion of the mask plate corresponding to the at least a portion of the first section S1 of the pixel definition material layer 24, and a light blocking portion of the mask plate corresponding to the remaining portion of the pixel definition material layer 24. Optionally, the method further includes developing the exposed pixel definition material layer 24 thereby dissolving (removing) the exposed portion of the pixel definition material layer 24. Referring to FIG. 5B, the entire first section S1 is removed thereby exposing the entire first side surface A1 of the sacrificial block 21. Subsequent to the exposure and development, the method further includes heating the remaining pixel definition material layer 24 thereby curing the pixel definition material layer 24.

In some embodiments, the pixel definition material layer 24 is made of a negative photoresist material. Optionally, the method includes exposing the second section S2 of the pixel definition material layer 24. Optionally, the method further includes exposing a portion of the first section S1 of the pixel definition material layer 24. Optionally, the step of exposing is performed using a mask plate. Optionally, the method includes exposing the pixel definition material layer 24 using a mask plate, a light blocking portion of the mask plate corresponding to the at least a portion of the first section S1 of the pixel definition material layer 24, and a light transmissive portion of the mask plate corresponding to the remaining portion of the pixel definition material layer 24. Optionally, the method further includes developing the exposed pixel definition material layer 24 thereby dissolving (removing) the unexposed portion of the pixel definition material layer 24. Referring to FIG. 5B, the entire first section S1 is removed thereby exposing the entire first side surface A1 of the sacrificial block 21.

Subsequent to curing the pixel definition material layer 24, the sacrificial layer is removed thereby forming the pixel definition layer. Referring to FIG. 5C, the method further includes forming an ink-jet printed layer by ink-jet printing.

Referring to FIG. 5C, when the sacrificial layer is removed and the ink-jet printed layer is formed, the third side surface A3' of the pixel definition block 10 prevents the ink in the ink-jet printed block 23 to climb up the side wall on the third side surface A3' of the pixel definition block 10 during the ink drying process, thereby reducing the likelihood of forming an ink-jet printed block 23 having the central portion thinner than the peripheral portion. An ink-jet printed block 23 having a substantially uniform thickness may be achieved by the present method, resulting in an even brightness distribution of light emission in the display panel having a display substrate fabricated by the present method.

Referring to FIG. 5C, the cross-section of each of the plurality of pixel definition blocks 10 along a plane normal to the base substrate 01 includes a first section proximal to the base substrate 01 (bottom section) and a second section distal to the base substrate 01 (top section). The first section has a substantially inverted trapezoidal shape, a short base of the inverted trapezoidal shape is on the second side surface A2'. The second section has a substantially rectangular shape.

Referring to FIG. 5C, subsequent to the removal of the sacrificial layer, a via V is formed between adjacent pixel definition blocks 10. A cross-section of the via V along a plane normal to the base substrate 01 includes a first section proximal to the base substrate 01 (bottom section) and a second section distal to the base substrate 01 (top section). The first section has a substantially trapezoidal shape, a long base of the trapezoidal shape is proximal to the base substrate 01 and a short base of the trapezoidal shape is distal to the base substrate 01. The second section has a substantially rectangular shape.

Figure 6A:
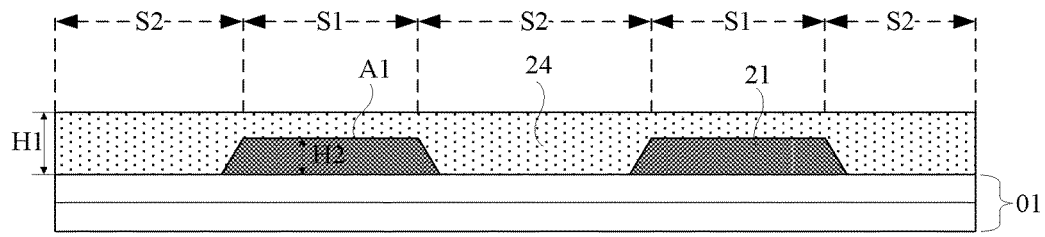
FIGS. 6A-6C illustrate a process of fabricating a display substrate in some embodiments according to the present disclosure.
Figure 6B:
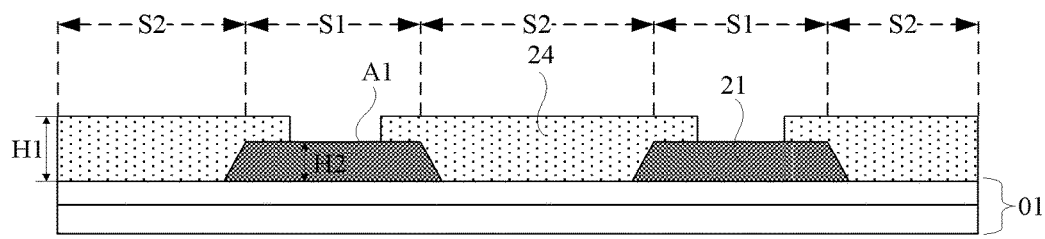
Figure 6C:
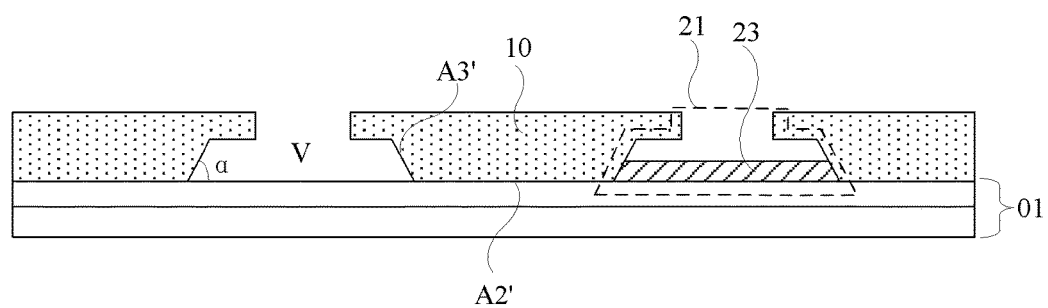

FIGS. 6A-6C illustrate a process of fabricating a display substrate in some embodiments according to the present disclosure. Referring to FIG. 6A, the pixel definition material layer 24 is formed to have a maximum thickness H1 along a direction normal to the base substrate 01 greater than a maximum thickness H2 along a direction normal to the base substrate 01 of the sacrificial layer. As shown in FIG. 6A, the pixel definition material layer 24 is formed to have a first section S1 covering the first side surface A1 of each of the plurality of sacrificial blocks 21 and a second section S2 outside the first section S1. Optionally, the first section S1 is in a subpixel region of the display substrate. Optionally, the second section S2 is in an inter-subpixel region of the display substrate. The pixel definition material layer 24 is formed to cover the sacrificial layer.

In some embodiments, prior to removing the sacrificial layer, the method further includes removing at least a portion of the first section S1 thereby exposing the sacrificial layer, and curing the pixel definition material layer 24 subsequent to removing at least a portion of the first section S1 and prior to removing the sacrificial layer. Referring to FIG. 68, only a portion of the first section S1 is removed to expose a portion of the first side surface A1 of the sacrificial block 21.

In some embodiments, the pixel definition material layer 24 is made of a positive photoresist material. Optionally, the method includes exposing at least a portion of the first section S1 of the pixel definition material layer 24. Optionally, the step of exposing is performed using a mask plate. Optionally, the method includes exposing the pixel definition material layer 24 using a mask plate, a light transmissive portion of the mask plate corresponding to the at least a portion of the first section S1 of the pixel definition material layer 24, and a light blocking portion of the mask plate corresponding to the remaining portion of the pixel definition material layer 24. Optionally, the method further includes developing the exposed pixel definition material layer 24 thereby resolving the exposed portion of the pixel definition material layer 24. Referring to FIG. 6B, only a portion of the first section S1 is removed to expose a portion of the first side surface A1 of the sacrificial block 21. Subsequent to the exposure and development, the method further includes heating the remaining pixel definition material layer 24 thereby curing the pixel definition material layer 24.

In some embodiments, the pixel definition material layer 24 is made of a negative photoresist material. Optionally, the method includes exposing the second section S2 of the pixel definition material layer 24. Optionally, the method further includes exposing the second section S2 and a portion of the first section S1 of the pixel definition material layer 24. Optionally, the step of exposing is performed using a mask plate. Optionally, the method includes exposing the pixel definition material layer 24 using a mask plate, a light blocking portion of the mask plate corresponding to the at least a portion of the first section S1 of the pixel definition material layer 24, and a light transmissive portion of the mask plate corresponding to the remaining portion of the pixel definition material layer 24. Optionally, the method further includes developing the exposed pixel definition material layer 24 thereby dissolving (removing) the unexposed portion of the pixel definition material layer 24. Referring to FIG. 6B, only a portion of the first section S1 is removed to expose a portion of the first side surface A1 of the sacrificial block 21.

Subsequent to curing the pixel definition material layer 24, the sacrificial layer is removed thereby forming the pixel definition layer. Referring to FIG. 6C, the method further includes forming an ink-jet printed layer by ink-jet printing.

Referring to FIG. 6C, when the sacrificial layer is removed and the ink-jet printed layer is formed, the third side surface A3' of the pixel definition block 10 prevents the ink in the ink-jet printed block 23 to climb up the side wall on the third side surface A3' of the pixel definition block 10 during the ink drying process, thereby reducing the likelihood of forming an ink-jet printed block 23 having the central portion thinner than the peripheral portion. An ink-jet printed block 23 having a substantially uniform thickness may be achieved by the present method, resulting in an even brightness distribution of light emission in the display panel having a display substrate fabricated by the present method.

Referring to FIG. 6C, the cross-section of each of the plurality of pixel definition blocks 10 along a plane normal to the base substrate 01 includes a first section proximal to the base substrate 01 (bottom section) and a second section distal to the base substrate 01 (top section). The first section has a substantially inverted trapezoidal shape, a short base of the inverted trapezoidal shape is on the second side surface A2'. The second section has a substantially rectangular shape.

Referring to FIG. 6C, subsequent to the removal of the sacrificial layer, a via V is formed between adjacent pixel definition blocks 10. A cross-section of the via V along a plane normal to the base substrate 01 includes a first section proximal to the base substrate 01 (bottom section) and a second section distal to the base substrate 01 (top section). The first section has a substantially trapezoidal shape, a long base of the trapezoidal shape is proximal to the base substrate 01 and a short base of the trapezoidal shape is distal to the base substrate 01. The second section has a substantially rectangular shape.

An aperture ratio of a display panel having a display substrate fabricated by the present method may be adjusted by removing at least a portion of the first section of the pixel definition material layer. In one example, the entire first section of the pixel definition material layer is removed (as shown in FIG. 5B). In another example, only a portion of the pixel definition material layer is removed (as shown in FIG. 6B). Removal of a larger portion of the first section of the pixel definition material layer results in a greater aperture ratio. For example, the display substrate fabricated according to the process illustrated in FIGS. 5A-5C has a greater aperture ratio than that fabricated according to the process illustrated in FIGS. 6A-6C.

Moreover, a higher aperture ratio may be achieved in a display substrate fabricated according to the process illustrated in FIGS. 5A-5C as compared to that fabricated according to the process illustrated in FIGS. 4A-4C. In a display substrate fabricated according to the process illustrated in FIGS. 4A-4C, the cross-section of the via formed between adjacent pixel definition blocks 10 subsequent to the removal of the sacrificial layer has a substantially trapezoidal shape. The width of the via gradually decrease from bottom to top, e.g., along a direction away from the base substrate 01. In a display substrate fabricated according to the process illustrated in FIGS. 5A-5C, the cross-section of the via formed between adjacent pixel definition blocks 10 subsequent to the removal of the sacrificial layer includes a first section proximal to the base substrate 0I (bottom section) and a second section distal to the base substrate 01 (top section). The first section has a substantially trapezoidal shape, a long base of the trapezoidal shape is proximal to the base substrate 01 and a short base of the trapezoidal shape is distal to the base substrate 01. The second section (the top section) has a substantially rectangular shape. Because the second section has a substantially rectangular shape, the width of the top portion of the via is larger than that of the via in a display substrate fabricated according to the process illustrated in FIGS. 4A-4C.

In some embodiments, the display substrate is an array substrate, and the thickness of the pixel definition material layer is greater than or equal to a sum of thicknesses of various organic functional layers (e.g., a hole injection layer, a hole transport layer, an organic light emitting layer, an electron transport layer, an electron injection layer). When the thickness of the pixel definition material layer remains the same, a fabricating process involving a pixel definition material layer having a thickness less than or equal to that of the sacrificial layer (e.g., the process illustrated in FIGS. 4A-4C) requires a greater amount of sacrificial layer material as compared to a fabricating process involving a pixel definition material layer having a thickness greater than that of the sacrificial layer (e.g., the process illustrated in FIGS. 5A-5C or FIGS. 6A-6C). Thus, a reduced fabricating cost may be achieved by adopting a process involving a pixel definition material layer having a thickness greater than that of the sacrificial layer.

When the pixel definition material layer is made of a positive photoresist, the step of curing the pixel definition material layer according to the process illustrated in FIGS. 4A-4C requires simply heating the pixel definition material layer. The step of curing the pixel definition material layer according to the process illustrated in FIGS. 5A-5C or FIGS. 6A-6C requires exposing and developing the pixel definition material layer prior to heating the pixel definition material layer. Thus, the process illustrated in FIGS. 4A-4C results in a simplified fabricating process as compared to the process illustrated in FIGS. 5A-5C or FIGS. 6A-6C.

Figure 7:
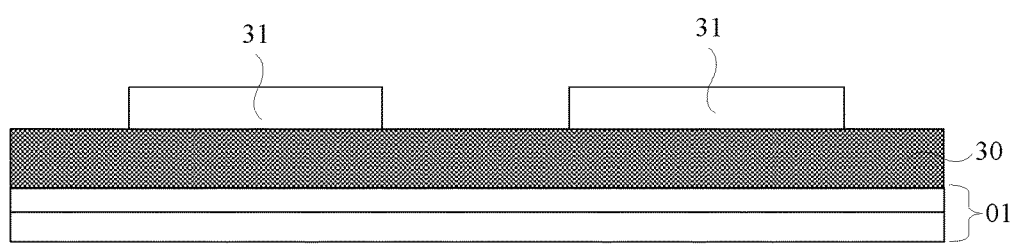
FIG. 7 illustrates a process of forming a sacrificial layer in some embodiments according to the present disclosure.

In some embodiments, the sacrificial layer is made of a metal material. The step of forming the sacrificial layer includes forming a metal material layer on the base substrate and patterning the metal material layer to form the plurality of sacrificial blocks. Optionally, the step of removing the sacrificial layer includes etching the sacrificial layer using a wet etchant. FIG. 7 illustrates a process of forming a sacrificial layer in some embodiments according to the present disclosure. Referring to FIG. 7, the method in some embodiments includes forming a metal material layer 30 on the base substrate 01, and patterning the metal material layer 30 to form a plurality of sacrificial blocks. Specifically, the step of patterning the metal material layer 30 includes forming a photoresist layer on a side of the metal material layer 30 distal to the base substrate 01; exposing and developing the photoresist layer to form a plurality of photoresist blocks 31, each of the plurality of photoresist blocks 31 corresponding to a sacrificial block; and etching the metal material layer 30 using the plurality of photoresist blocks 31 as a mask plate, thereby forming a plurality of sacrificial blocks (e.g., sacrificial blocks 21 as shown in FIG. 3B).

Referring to FIG. 3B, in some embodiments, the average tangential inclination of the third side surface A3 of the sacrificial block 2 with respect to the second side surface A2 of the sacrificial block 21 (and optionally, the included angle between the third side surface A3 and the second side surface A2 of the sacrificial block 21) is an acute angle, e.g., an acute angle in a range of approximately 30 degrees and approximately 75 degrees. By having an average tangential inclination (or an included angle) no more than approximately 75 degrees, a subsequently formed pixel definition layer can prevent ink climbing up the side wall of the pixel definition layer more effectively. By having an average tangential inclination (or an included angle) no less than approximately 30 degrees, a distance between adjacent subpixel regions (e.g., subpixel regions 101 as shown in FIG. 4B) can be reduced, thereby enhancing pixels per inch (PPI) of the display substrate.

The average tangential inclination of the third side surface A3 of the sacrificial block 21 with respect to the second side surface A2 of the sacrificial block 21 (and optionally, included angle between the third side surface A3 and the second side surface A2 of the sacrificial block 21) may be adjusted by controlling process variables of the fabrication process. Referring to FIG. 7, in some embodiments, subsequent to exposing and developing the photoresist layer to form a plurality of photoresist blocks 31, the step of patterning the metal material layer 30 further includes heating the plurality of photoresist blocks 31 in a heating duration. A relatively longer heating duration results in a relatively larger average tangential inclination, or included angle between the third side surface A3 and the second side surface A2 of the sacrificial block. 21, and a relatively shorter heating duration results in a relatively smaller average tangential inclination or included angle between the third side surface A3 and the second side surface A2 of the sacrificial block 21. In some embodiments, the step of etching the metal material layer 30 using a wet etchant, e.g., an etching solution. Optionally, the step of etching the metal material layer 30 to form the plurality of sacrificial blocks 21 is performed by spraying an etchant solution onto the display substrate to etch the metal material layer 30. Optionally, the step of etching the metal material layer 30 to form the plurality of sacrificial blocks 21 is performed by soaking the display substrate in an etchant solution to etch the metal material layer 30. Optionally, a relatively larger average tangential inclination or included angle between the third side surface A3 and the second side surface A2 of the sacrificial block 21 may be formed in a spraying etching process as compared to that formed in a soaking etching process.

Subsequent to forming the sacrificial layer having a plurality of sacrificial blocks and forming the pixel definition material layer, the method includes removing the plurality of sacrificial blocks 21. Optionally, the sacrificial layer is made of a metal material, and the step of removing the plurality of sacrificial blocks 21 includes etching the plurality of sacrificial blocks 21 using a wet etchant thereby completely removing the plurality of sacrificial blocks 21. Optionally, the wet etchant includes one or a combination of etchants selected from the group consisting of hydrochloric acid, nitric acid, and phosphoric acid. Optionally, the step of etching the plurality of sacrificial blocks 21 is performed by spraying an etchant solution onto the display substrate to etch the plurality of sacrificial blocks 21. Optionally, the step of etching the plurality of sacrificial blocks 21 is performed by soaking the display substrate in an etchant solution to etch the plurality of sacrificial blocks 21.

In some embodiments, the metal material layer 30 (and the plurality of sacrificial blocks 21) is made of one or a combination of metals selected from the group consisting of molybdenum, aluminum, and silver. Optionally, the metal material layer 30 (and the plurality of sacrificial blocks 21) is made of molybdenum, which has a faster etching rate.

In another aspect, the present disclosure provides a display substrate, in some embodiments, the display substrate includes a base substrate and a pixel definition layer having a plurality of pixel definition blocks on the base substrate. In the present display substrate, each of the plurality of pixel definition blocks includes a central portion and a peripheral portion surrounding the central portion, a thickness of the peripheral portion along a direction normal to the base substrate decreases along a direction from the central portion toward the peripheral portion. Optionally, each of the plurality of pixel definition blocks has a first side surface distal to the base substrate and a second side surface facing the first side surface and proximal to the base substrate, and an area of the second side surface is less than an area of the first side surface. Optionally, the first side surface and the second side surface are substantially parallel to each other. Optionally, each of the plurality of pixel definition blocks has a third side surface connecting the first side surface and the second side surface, and an average tangential inclination of the third side surface with respect to the second side surface is an obtuse angle. Optionally, an included angle between the third side surface and the second side surface is an obtuse angle. Optionally, the obtuse angle is in a range of approximately 105 degrees to approximately 150 degrees. Optionally, an average tangential inclination of the third side surface with respect to the first side surface is an acute angle. Optionally, an included angle between the third side surface and the first side surface is an acute angle. Optionally, the acute angle is in a range of approximately 30 degrees and approximately 75 degrees. Optionally, a cross-section of each of the plurality of pixel definition blocks along a plane normal to the base substrate has a substantially inverted trapezoidal shape, a short base of the inverted trapezoidal shape is on the second side surface and a long base of the inverted trapezoidal shape is on the first side surface. Optionally, a cross-section of each of the plurality of pixel definition blocks along a plane normal to the base substrate includes a first section proximal to the base substrate and a second section distal to the base substrate, the first section has a substantially inverted trapezoidal shape and a short base of the inverted trapezoidal shape is on the second side surface, and the second section has a substantially rectangular shape.

Optionally, the display substrate is an array substrate. Optionally, the display substrate is a color filter substrate.

In some embodiments, the display substrate further includes an ink-jet printed layer having a plurality of ink-jet printed blocks in a subpixel region of the display substrate. Optionally, each of the plurality of ink-jet printed blocks includes a central portion and a peripheral portion surrounding the central portion, a thickness of the peripheral portion along a direction normal to the base substrate decreases along a direction from the central portion toward the peripheral portion. Optionally, each of the plurality of ink-jet printed blocks has a first side surface distal to the base substrate and a second side surface facing the first side surface and proximal to the base substrate, and an area of the first side surface is less than an area of the second side surface. Optionally, the first side surface and the second side surface are substantially parallel to each other. Optionally, each of the plurality of ink-jet printed blocks has a third side surface connecting the first side surface and the second side surface, an average tangential inclination of the third side surface with respect to the second side surface is an acute angle. Optionally, an included angle between the third side surface and the second side surface is an acute angle. Optionally, the acute angle is in a range of approximately 30 degrees and approximately 75 degrees. Optionally, an average tangential inclination of the third side surface with respect to the first side surface is an obtuse angle. Optionally, an included angle between the third side surface and the first side surface is an obtuse angle. Optionally, the obtuse angle is in a range of approximately 105 degrees to approximately 150 degrees. Optionally, a cross-section of each of the plurality of ink-jet printed blocks along a plane normal to the base substrate has a substantially trapezoidal shape, and a short base of the trapezoidal shape is on the first side surface and a long base of the trapezoidal shape is on the second side surface.

In some embodiments, the display substrate is an array substrate, and the pixel definition layer functions to separate adjacent subpixels in the array substrate. Optionally, the pixel definition layer is made of a resin material. In some embodiments, the display substrate is a color filter substrate. Optionally, the pixel definition layer is made of a resin material and further includes a black pigment. Optionally, the pixel definition layer in the color filter substrate functions as a black matrix. Examples of appropriate resin materials include, but are not limited to, an epoxy resin.

In some embodiments, the display substrate includes a via between adjacent pixel definition blocks for forming the ink-jet printed blocks. The via is at least in part defined by the third side surfaces of adjacent pixel definition blocks and the base substrate. Optionally, a cross-section of the via along a plane normal to the base substrate has a substantially trapezoidal shape. Optionally, a cross-section of the via along a plane normal to the base substrate includes a first section proximal to the base substrate (bottom section) and a second section distal to the base substrate (top section). The first section has a substantially trapezoidal shape, a long base of the trapezoidal shape is proximal to the base substrate and a short base of the trapezoidal shape is distal to the base substrate. The second section has a substantially rectangular shape.

In the present display substrate, the ink-jet printed block has a substantially uniform thickness. As compared to a conventional display panel, a display panel having the present display substrate has an even brightness distribution of light emission.

In another aspect, the present disclosure provides a display substrate fabricated by a method described herein.

In another aspect, the present disclosure provides a display panel having a display substrate described herein or fabricated by a method described herein.

In another aspect, the present disclosure provides a display apparatus having a display panel described herein. Examples of appropriate display apparatuses includes, but are not limited to, an electronic paper, a mobile phone, a tablet computer, a television, a monitor, a notebook computer, a digital album, a OPS, etc.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term. "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A method of fabricating a display substrate, comprising:
    forming a sacrificial layer comprising a plurality of sacrificial blocks on a base substrate;
    forming a pixel definition material layer on the base substrate subsequent to forming the sacrificial layer;
    removing the sacrificial layer thereby forming a pixel definition layer defining a plurality of subpixel apertures; and forming a light emitting layer in the plurality of subpixel regions;

wherein a respective one of the plurality of sacrificial blocks is formed to have a first side surface away from the base substrate, a second side surface facing the first side surface and proximal to the base substrate, and a third side surface connecting the first side surface and the second side surface; and an average tangential inclination of the third side surface with respect to the second side surface is an acute angle;

wherein a cross-section of a respective one of the plurality of subpixel apertures along a plane normal to the base substrate has a shape comprising a rectangle stacked on top of a trapezoid, the rectangle being on a side of the trapezoid away from the base substrate; and the method further comprises, subsequent to removing the sacrificial layer, forming an ink-jet printed block in the respective one of the plurality of subpixel apertures.

2. The method of claim 1, wherein an included angle between the third side surface and the second side surface of a respective one of the plurality of sacrificial blocks is an acute angle.

3. The method of claim 1, wherein the acute angle is in a range of approximately 30 degrees and approximately 75 degrees.

4. The method of claim 2, wherein a cross-section of the respective one of the plurality of sacrificial blocks along a plane normal to the base substrate has a substantially trapezoidal shape; and a short base of the substantially trapezoidal shape is on the first side surface and a long base of the substantially trapezoidal shape is on the second side surface.

5. The method of claim 1, wherein the pixel definition layer is formed to comprise a plurality of pixel definition blocks;

a respective one of the plurality of pixel definition blocks is formed to have a first side surface away from the base substrate, a second side surface facing the first side surface and proximal to the base substrate, and a third side surface connecting the first side surface and the second side surface;

an average tangential inclination of the third side surface with respect to the second side surface is an obtuse angle; and the obtuse angle is in a range of approximately 105 degrees to approximately 150 degrees.

6. The method of claim 1, wherein the pixel definition layer is formed to comprise a plurality of pixel definition blocks;

a cross-section of a respective one of the plurality of pixel definition blocks along a plane normal to the base substrate has a substantially inverted trapezoidal shape; and a short base of the substantially inverted trapezoidal shape is on the second side surface and a long base of the substantially inverted trapezoidal shape is on the first side surface.

7. The method of claim 1, wherein the pixel definition layer is formed to comprise a plurality of pixel definition blocks;

a cross-section of a respective one of the plurality of pixel definition blocks along a plane normal to the base substrate comprises a first section proximal to the base substrate and a second section away from the base substrate;

the first section has a substantially inverted trapezoidal shape and a short base of the substantially inverted trapezoidal shape is on the second side surface; and the second section has a substantially rectangular shape.

8. The method of claim 1, wherein the ink-jet printed block is formed to have a first side surface away from the base substrate, a second side surface facing the first side surface and proximal to the base substrate, and a third side surface connecting the first side surface and the second side surface; and an average tangential inclination of the third side surface with respect to the second side surface is an acute angle.

9. The method of claim 8, wherein the acute angle is in a range of approximately 30 degrees and approximately 75 degrees.

10. The method of claim 1, wherein the pixel definition material layer is formed to have a maximum thickness along a direction normal to the base substrate smaller than or equal to that of the sacrificial layer; and the method further comprises curing the pixel definition material layer prior to removing the sacrificial layer.

11. The method of claim 1, wherein the pixel definition material layer is formed to have a maximum thickness along a direction normal to the base substrate greater than that of the sacrificial layer;

the respective one of the plurality of sacrificial blocks has a first side surface away from the base substrate and a second side surface facing the first side surface and proximal to the base substrate;

the pixel definition material layer is formed to have a first section covering the first side surface of the respective one of the plurality of sacrificial blocks and a second section outside the first section; and the method further comprising, prior to removing the sacrificial layer, removing at least a portion of the first section thereby exposing the sacrificial layer; and curing the pixel definition material layer subsequent to removing at least a portion of the first section and prior to removing the sacrificial layer.

12. The method of claim 1, wherein the sacrificial layer is made of a metal material;

forming the sacrificial layer comprises forming a metal material layer on the base substrate and patterning the metal material layer to form the plurality of sacrificial blocks; and removing the sacrificial layer comprises etching the plurality of sacrificial blocks using a wet etchant.

13. The method of claim 12, wherein the wet etchant comprises one or a combination of etchants selected from the group consisting of hydrochloric acid, nitric acid, and phosphoric acid.

14. The method of claim 12, wherein the metal material layer is made of one or a combination of metals selected from the group consisting of molybdenum, aluminum, and silver.

15. The method of claim 1, wherein the respective one of the plurality of sacrificial blocks is formed to have a shape selected form the group consisting of a truncated rectangular pyramid shape, a truncated square pyramid shape, and a truncated cone shape.

16. A method of fabricating a display substrate, comprising:

forming a sacrificial layer comprising a plurality of sacrificial blocks on a base substrate;

forming a pixel definition material layer on the base substrate subsequent to forming the sacrificial layer;

removing the sacrificial layer thereby forming a pixel definition layer defining a plurality of subpixel apertures; and forming a light emitting layer in the plurality of subpixel regions;

wherein the respective one of the plurality of sacrificial blocks is formed to have a first side surface away from the base substrate, a second side surface facing the first side surface and proximal to the base substrate, and a third side surface connecting the first side surface and the second side surface; and an average tangential inclination of the third side surface with respect to the second side surface is an acute angle;

wherein a cross-section of a respective one of the plurality of subpixel apertures along a plane normal to the base substrate has a shape comprising a rectangle stacked on top of a trapezoid, the rectangle being on a side of the trapezoid away from the base substrate; and the pixel definition layer is formed to have an overhang protruding toward a center of the respective one of the plurality of subpixel apertures so that a width of the rectangle is smaller than a width of a short base of the trapezoid.

17. The method of claim 16, further comprising forming an ink-jet printed block in the respective one of the plurality of subpixel apertures subsequent to removing the sacrificial layer.

18. The method of claim 17, wherein the ink-jet printed block is formed to have a first side surface away from the base substrate, a second side surface facing the first side surface and proximal to the base substrate, and a third side surface connecting the first side surface and the second side surface; and an average tangential inclination of the third side surface with respect to the second side surface is an acute angle.

19. The method of claim 18, wherein the acute angle is in a range of approximately 30 degrees and approximately 75 degrees.

20. The method of claim 16, wherein an included angle between the third side surface and the second side surface of a respective one of the plurality of sacrificial blocks is an acute angle; and the acute angle is in a range of approximately 30 degrees and approximately 75 degrees.

* * * * *